(12) United States Patent
Doris

(10) Patent No.: US 7,944,383 B2
(45) Date of Patent: May 17, 2011

(54) DATA PROCESSING DEVICE COMPRISING ADC UNIT

(75) Inventor: Konstantinos Doris, Amsterdam (NL)

(73) Assignee: NXP B.V., Eindhoven (NL)

( * ) Notice: Subject to any disclaimer, the term of this patent is extended or adjusted under 35 U.S.C. 154(b) by 55 days.

(21) Appl. No.: 12/519,284

(22) PCT Filed: Nov. 30, 2007

(86) PCT No.: PCT/IB2007/054869
§ 371 (c)(1),
(2), (4) Date: Jun. 15, 2009

(87) PCT Pub. No.: WO2008/072130
PCT Pub. Date: Jun. 19, 2008

(65) Prior Publication Data
US 2010/0085231 A1    Apr. 8, 2010

(30) Foreign Application Priority Data

Dec. 14, 2006  (EP) .................................... 06025938

(51) Int. Cl.
*H03M 1/00* (2006.01)
(52) U.S. Cl. ........................................ 341/139; 341/155
(58) Field of Classification Search .................. 341/139, 341/155, 120, 118, 141; 375/261; 398/205
See application file for complete search history.

(56) References Cited

U.S. PATENT DOCUMENTS

| | | | |
|---|---|---|---|
| 4,937,579 A | 6/1990 | Maio et al. | |
| 5,777,569 A * | 7/1998 | Naruki et al. | 341/155 |
| 6,097,324 A | 8/2000 | Myer et al. | |
| 6,104,329 A | 8/2000 | Kawano | |

(Continued)

FOREIGN PATENT DOCUMENTS

| | | |
|---|---|---|
| EP | 1111795 A | 6/2001 |
| EP | 1233615 A1 | 8/2002 |
| WO | 9828853 A1 | 7/1998 |

(Continued)

OTHER PUBLICATIONS

Oh, Yangjin, et al; "System Embedded ADC Calibration for OFDM Receivers"; IEEE Transactions on Circuits and Systems-I: Regular Papers, vol. 53, No. 8; Aug. 2006; pp. 1693-1703.

*Primary Examiner* — Rexford N Barnie
*Assistant Examiner* — Joseph Lauture

(57) ABSTRACT

A device (100) for processing data, the device (100) comprising a plurality of signal paths (130, 140, 150) each receiving an identical analog input signal (104), at least one signal conditioning unit (101 to 103) in at least one of the plurality of signal paths (130, 140, 150), wherein each signal conditioning unit (101 to 103) is adapted for generating a respective analog intermediate signal (105 to 107) by manipulating a property, particularly an amplitude, of the analog input signal (104), and a plurality of analog to digital converting units (108 to 110) each of which being assigned to a corresponding one of the plurality of signal paths (130, 140, 150) and being supplied with the analog input signal (104) or a respective analog intermediate signal (105 to 107), wherein each of the plurality of analog to digital converting units (108 to 110) is adapted for generating a respective digital intermediate signal (111 to 113) based on the respective analog intermediate signal (105 to 107) or based on the analog input signal (104); a digital signal processing unit (114) supplied with the plurality of digital intermediate signals (111 to 113) and adapted for generating a digital output signal (115) by processing the digital intermediate signals (111 to 113).

7 Claims, 4 Drawing Sheets

U.S. PATENT DOCUMENTS

| | | |
|---|---|---|
| 6,317,065 B1 | 11/2001 | Raleigh et al. |
| 6,445,328 B1 | 9/2002 | Francis |
| 6,473,013 B1 | 10/2002 | Velazquez et al. |
| 6,498,577 B1 | 12/2002 | Lin |
| 6,501,870 B1 * | 12/2002 | Banerjee et al. ................ 385/24 |
| 7,095,963 B2 * | 8/2006 | Knaack et al. ................ 398/205 |
| 7,343,538 B2 * | 3/2008 | Ricca et al. ................... 714/740 |
| 7,514,924 B2 * | 4/2009 | Luedeke et al. ............... 324/309 |
| 2003/0095058 A1 | 5/2003 | Matsumoto |
| 2005/0215211 A1 | 9/2005 | Young et al. |

FOREIGN PATENT DOCUMENTS

| | | |
|---|---|---|
| WO | 0199282 A1 | 12/2001 |
| WO | 2006/109013 A | 10/2006 |

\* cited by examiner

US 7,944,383 B2

DATA PROCESSING DEVICE COMPRISING ADC UNIT

FIELD OF THE INVENTION

The invention relates to a device for processing data.

Moreover, the invention relates to method of processing data.

Beyond this, the invention relates to a program element.

Further, the invention relates to a computer-readable medium.

BACKGROUND OF THE INVENTION

In electronics, an analog-to-digital converter (ADC) may be denoted as a device for converting an analog signal to a digital (usually binary) code. Simple switches, a network of resistors, current sources or capacitors may implement this conversion.

For instance when transmitting signals between a transmitter and a receiver, an ADC operation may be necessary at the side of the receiver.

EP 1,233,615 A1 discloses to minimize an analog/digital converter over-dimensioning within the framework of reception of signals originating from a satellite and exhibiting power levels that can vary over time. A technique of automatic gain control is disclosed by EP 1,233,615 A1, which handles the setting of the noise level associated with the amplified signal. The automatic gain control is achieved by neutralizing the signal received by the antenna, and by adjusting the gain during the neutralization of the signal received until a predetermined noise level is obtained at the end of the reception facility.

However, the procedure of EP 1,233,615 A1 may be complex and may lack reliability.

OBJECT AND SUMMARY OF THE INVENTION

It is an object of the invention to provide an efficient analog-to-digital converter.

In order to achieve the object defined above, a device for processing data, a method of processing data, a program element and a computer readable medium according to the independent claims are provided.

According to an exemplary embodiment of the invention, a device for processing data is provided, the device comprising a plurality of signal paths each receiving an identical analog input signal, at least one signal conditioning unit (or many different signal conditioning units) in at least one of the plurality of signal paths, wherein each signal conditioning unit is adapted for generating a respective analog intermediate signal by manipulating properties (such as amplitude) of the analog input signal, a plurality of analog to digital converting units each of which being assigned to a corresponding one of the plurality of signal paths and being supplied with the analog input signal (for instance when no signal conditioning unit is located upstream the ADC in this signal path) or a respective analog intermediate signal (for instance when a signal conditioning unit is located upstream the ADC in this signal path), wherein each of the plurality of analog to digital converting units is adapted for generating a respective digital intermediate signal based on the respective analog intermediate signal (for instance when a signal conditioning unit is located upstream the ADC in this signal path) or based on the analog input signal (for instance when no signal conditioning unit is located upstream the ADC in this signal path), and a digital signal processing unit supplied with the plurality of digital intermediate signals, wherein the digital signal processing unit is adapted for generating a digital output signal by processing the digital intermediate signals.

According to another exemplary embodiment of the invention, a method of processing data is provided, the method comprising supplying an identical analog input signal to each of a plurality of signal paths, generating, by at least one signal conditioning unit in at least one of the plurality of signal paths, a respective analog intermediate signal by manipulating properties (such as amplitude) of the analog input signal, supplying a plurality of analog to digital converting units, each of which being assigned to a corresponding one of the plurality of signal paths, with the respective analog intermediate signal or with the analog input signal for generating a respective digital intermediate signal based on the respective analog intermediate signal or based on the analog input signal, and performing digital signal processing with the plurality of digital intermediate signals for generating a digital output signal by processing the digital intermediate signals.

According to still another exemplary embodiment of the invention, a program element (for instance a software routine, in source code or in executable code) is provided, which, when being executed by a processor, is adapted to control or carry out a data processing method having the above mentioned features.

According to yet another exemplary embodiment of the invention, a computer-readable medium (for instance a CD, a DVD, a USB stick, a floppy disk or a harddisk) is provided, in which a computer program is stored which, when being executed by a processor, is adapted to control or carry out a data processing method having the above mentioned features.

The data sampling scheme according to embodiments of the invention can be realized by a computer program, that is by software, or by using one or more special electronic optimization circuits, that is in hardware, or in hybrid form, that is by means of software components and hardware components.

The term "signal conditioning unit" may particularly denote any circuitry or procedure that is capable of modifying or manipulating an input signal to generate a modified output signal. Such a manipulation may include filtering, amplification, attenuation, equalization, modulation, integration, etc.

The term "analog to digital converting unit" may particularly denote any circuitry or procedure capable of converting an analog input signal into a digital output signal. When an input signal exceeds a processing capability or a full range of the analog to digital converting unit, clipping effects may occur at signal portions exceeding the processing capability of the ADC unit.

The term "digital signal processing unit" (DSP unit) may particularly denote any circuitry or procedure being capable of processing several digital signal portions to generate or assemble a global digital output signal. This processing may include constructing the global digital output signal based on contributions of the input signals in accordance with an algorithm. When the digital signal processing unit is aware of the signal conditioning characteristic and/or of the analog to digital converting capabilities and limitations of the corresponding upstream located entities, a signal reconstruction scheme may be made particularly efficiently.

The term "full scale range" or quantization range may denote a property of an analog to digital converting unit to process a corresponding signal within specific limits. When the full scale range of processable amplitudes is exceeded, the analog to digital converting unit may not properly perform its converting function in this exceeding range which may result in clipping effects.

The term "clipping" may particularly denote the behavior of an analog to digital converting unit when a full scale range of processable amplitudes is exceeded. Such a clipping may be detected on the basis of the output signal of such an analog to digital converting unit.

A "gain factor" of an amplifier may denote a numerical factor according to which the amplitude of a signal is increased by the amplification function. When the gain factor is larger than one, the signal is emphasized. When the gain factor is smaller than one, the signal is damped or attenuated. A serial connection of a first amplifier having a gain factor A and a second amplifier having a reciprocal gain factor 1/A may result in a signal with an unchanged amplitude.

The term "signal path" may particularly denote a propagation path along which a signal travels. Different signal paths may be connected in parallel to one another. A signal path may include an ADC unit and, optionally, a signal-conditioning unit. The signal paths may be arranged between the input signal on the one hand and the DSP unit on the other hand.

According to an exemplary embodiment of the invention, an analog to digital converting device may be provided which is capable of converting an analog input signal into a digital output signal by applying a sampling method capable of reducing the dynamic range requirements of a plurality of analog digital converting units connected in parallel, while simultaneously improving the receiver robustness. By such a multiple analog to digital converting architecture to achieve a single global analog to digital converting function, different portions of the input signal can be processed by different analog to digital converting units, thereby enabling to combine a plurality of relatively simple ADCs having restricted dynamic ranges to a single high performance analog to digital converter device.

In this context, it may be possible to operate the analog to digital converting units at operation points (that can be adjusted by adjusting a gain value of amplifiers of corresponding signal condition units or by adding or subtracting a signal contribution), so that clipping or non-clipping of specific analog to digital converting units in specific signal ranges may be promoted to force each analog to digital converting unit to output a portion of a digitized signal which portions may then be assembled by the digital signal processing unit to form a global output signal.

Such a signal processing architecture may be applied advantageously in the context of a sampling method to sample broadband signals, simultaneously relaxing the requirements of an ADC used in a receiver that processes broadband signals.

According to an exemplary embodiment of the invention, an array of signal conditioning units, an array of ADCs and a digital signal processing circuit may be used. Each signal conditioning circuit may process the same input RF (radio frequency) signal. Each one may emphasize a specific part of the total RF signal that will be detected by the following ADC unit. This ADC unit may be specifically adapted to detect those emphasized parts in an accurate manner. A dedicated digital signal processing circuit connected in a signal propagation path after the ADC array may receives all the digital streams and from them constructs one digital output signal representing or reflecting the analog input signal.

Different ADCs of the ADC array may or may not have different resolutions or quantization ranges, i.e. may be identical or may differ. The signal conditioning units may define, via adjusting amplifier values or by adding or subtracting a signal contribution, ranges in which the assigned ADCs work properly. Thereby, at the output of the ADCs, contributions to a digital output signal are provided which are analyzed and put together by a clipping detection and sample replacement architecture of a digital signal processing unit. On-chip detection hardware can identify a crest factor (or any other representative figure that gives information of the amount of clipping) of the signal received and steer, with the help of the dedicated digital block, the choice of the amplifying values to allow higher/lower abrupt excursions of the input signal to be captured.

Exemplary embodiments of the invention may use attenuation of an input signal in a fixed or in a programmable manner and also separation of the total amplitude to parts being digitized by different ADC units.

Other exemplary embodiments can for example include:

1. Adding/subtracting half the full scale reference (or any other value) of the ADC to the AC input signal, and then amplification to emphasize the signal amplitudes lower/higher than a prefixed value (for instance at the most significant bit), and clipping all the other amplitudes.

2. Any use of a filter in combination with amplification/attenuation (for instance when many bands are present and it is desired to separate them). It is also possible to introduce power different between bands.

According to an exemplary embodiment of the invention, the individual signal conditioning units may emphasize/separate both amplitudes in frequency parts of the original RF signal such that each of them is sampled and quantisized in an advantageous manner. The resulting outputs may then be processed by a dedicated (for instance fixed or programmable) digital signal circuit that uses the multiple separate data streams and uses algorithms to build a proper representation of the original signal and to control/program the signals proceeding it.

In other words, the gain can be programmable with information being gathered from the ADC output or the channel decoders of a typical telecom system (or any intermediate node of these circuits). In this way, on-chip bit error rates measurement processes can steer the proper attenuation and other processing. It is possible to control different ADC sampling rates, programmable resolutions for the ADCs, etc., as well as the use of bit error rate measurements. In other words, a control path may be provided between the digital processing circuit and the ADC. Two or three or more ADCs may be connected in parallel, wherein the ADCs may be constructed in different ways or identical. The result is a digitation with non-uniformly placed quantization levels.

Although there is no absolute requirement to have multiple ADC units to make the system work, when multiple ADCs are implemented properly, the system can become more efficient or may provide better performance. It may also be possible to construct the system with one main ADC, providing the other ADCs for extra improvement only when and if needed (for instance deactivated when they are not needed). However, it is also possible to have a single ADC, one signal conditioning circuit and the signal processing block after the ADC and use it to perform several actions (control of equalization, number of ADC bits, calibration of ADCs, etc.).

According to an exemplary embodiment of the invention, a multiple ADC architecture with a dedicated DSP is provided that allows to combine all the signal pieces of the ADCs together (each one emphasizing on different signal aspects) to sample one signal. The dual, triple ADC configuration described according to exemplary embodiments are particular types that aim to extend the range of the ADC such that larger signals are captured (dual ADC) or in addition to further improve or optimize the internal use of hardware components of the ADC (triple ADC). However, the provision of four or more ADCs is possible as well.

The amplification factor of the amplifiers (for instance 1 and A for the dual-ADC, 1,1, and 1/A for the triple ADC) can as well be scaled up by a global amplification. For instance, for the dual-ADC, the amplification can be A1 and A1*A2 (with 1/A2 at the digital side) instead of 1 and A (with 1/A at the digital side). This holds for any of the below described embodiments.

Exemplary embodiments of the invention provide a broadband multi-channel receiver with an advantageous ADC architecture. Such a multi ADC system may offer an extended range based on instantaneous coarse quantization, meaning that there is no issue of memory. Of course, an additional AD converter may be required but this may still be more cost-effective than making one converter with higher resolution.

Next, further exemplary embodiments of the device for processing data will be explained. However, these embodiments also apply to the method, to the program element and the computer-readable medium.

Each signal conditioning unit may be adapted for selectively amplifying or attenuating or integrating the analog input signal when generating the respective analog intermediate signal to thereby adjust a portion of the respective analog intermediate signal being processable by the assigned one of the plurality of analog to digital converting units in view of a value of a full scale range of the assigned one of the plurality of analog to digital converting units. In other words, each signal conditioning unit may define by its dedicated signal manipulation function a way according to which the assigned ADC which its specific properties will function. For instance, since each ADC has only a limited full-scale range or quantization range in which it may convert the signal properly, the selective attenuation or damping may define a portion of the input signal that can be processed properly by the corresponding ADC. In other words, the selection of the signal-conditioning characteristic may define the range of the ADC in which the input signal is processed.

Still referring to the previously described embodiment, it may be particularly advantageous to adapt the digital signal processing unit for detecting clipping of any one of the digital intermediate signals of any one of the plurality of analog to digital converting units and for generating the digital output signal under consideration of a detected clipping. Clipping may occur, for example, when the input signal has been amplified to a value that at least a part of the signal is out of the full-scale range of the corresponding ADC. In this case, clipping may occur, which means that a proper signal processing of the corresponding ADC is not possible in this range. When this clipping is detected by the DSP, the DSP may notice that the clipping portion of the output signal of the respective ADC is not usable, so that the DSP may recognize that this ADC is only used for a rest of the input signal. Therefore, clipping detection may be used as a selection criterion for constructing the global digital output signal by the DSP.

Still referring to the previously described embodiment, the digital signal processing unit may be adapted for substituting a clipping portion of any one of the digital intermediate signals by a non-clipping portion of any other one of the digital intermediate signals. For instance, a first ADC may be operated with an attenuation of the input signal so that its signal processing over the entire range is acceptable. A second ADC may be used for detecting (with high accuracy) only a central portion of the amplitude distribution of the input signal. Then, using the central portion processed by the second ADC and border portions processed by the first ADC, it may be possible to appropriately reconstruct the original signal without the need of very complex, expensive and slow ADC units.

Each signal conditioning unit may be adapted for generating the respective analog intermediate signal by manipulating both frequency and amplitude of the analog input signal. Therefore, not only the amplitude, but also the frequency of the signal conditioning units may be altered to select specific portions of the input signal to be processed by the corresponding ADC.

Each signal conditioning unit may be adapted for emphasizing specific parts of the analog input signal when generating the respective analog intermediate signal. Such a specific emphasizing may assist in the selection of individual portions to be processed by the respective ADC and to be used for digital signal representation.

More particularly, each of the plurality of analog to digital converting units may be adapted for generating the respective digital intermediate signal specifically based on the respective emphasized specific part of the analog input signal. By assigning each one of the ADCs a specific range in which it can process the analog signal properly to generate a corresponding portion of the digital output signal, a mosaic-like multiband signal sampling architecture may be provided in which the various ADCs cooperate to form a global digital output signal, wherein the DSP functions to put together pieces of the individual ADC output signals.

The digital signal processing unit may be adapted for providing at least one of the signal conditioning units and/or at least one of the plurality of analog to digital converting units with a feedback signal for adjusting the operation of the respective component. In other words, the DSP may steer the ADCs and/or the signal conditioning units based on a processing in a previous iteration, thereby allowing a dynamic adjustment of the functionality.

A first one of the plurality of signal conditioning units may comprise a first amplifier having a gain factor of essentially one (or having no amplification at all), and a second one of the plurality of signal conditioning units may comprise a second amplifier having a different gain factor. In addition, a third amplifier may be connected between the one of the plurality of analog to digital converting units connected to the second amplifier on the one hand and the digital signal processing unit on the other hand, wherein the third amplifier has a gain factor being reciprocal to the gain factor of the second amplifier. For instance, the third amplifier may increase the amplitude of the signal output by the corresponding ADC to compensate for the signal attenuation of the second amplifier. Therefore, signal artifacts may be efficiently suppressed.

The digital signal processing unit may be adapted for detecting clipping of the digital intermediate signal provided by the analog to digital converting unit coupled to the first amplifier and may be adapted to replace a clipped sample of the analog to digital converting unit coupled to the first amplifier by a non-clipped sample of the analog to digital converting unit coupled to the second amplifier. Therefore, the two ADCs and the three amplifiers may function together to provide only non-clipped sample portions used by the DSP.

A value of the full scale range of the analog to digital converting unit coupled to the first amplifier may be smaller than a value of a full scale range of the analog to digital converting unit coupled to the second amplifier, and simultaneously a resolution of the analog to digital converting unit coupled to the first amplifier may be larger than a resolution of the analog to digital converting unit coupled to the second amplifier. In other words, one ADC may cover a large range of amplitudes but may have a small resolution, and the other one may have a larger resolution but may only cover a small range. The combination of such ADCs may allow to process even high amplitude analog input signals with high accuracy and with acceptable requirements regarding the quality of the ADC units. This may be particularly suitable for processing essentially Gaussian shaped signals.

A third one of the plurality of signal conditioning units may comprise a forth amplifier having a gain factor of one, wherein a value of a full scale range of the analog to digital converting unit coupled to the first amplifier may be smaller than a value of a full scale range of the analog to digital converting unit coupled to the forth amplifier. At the same time, a resolution of the analog to digital converting unit coupled to the first amplifier may be larger than a resolution of the analog to digital converting unit coupled to the forth amplifier. Such a configuration involves a three ADC unit architecture, wherein each chain of signal conditioning unit and assigned ADC is specifically adapted to contribute to a specific portion of the signal processing.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
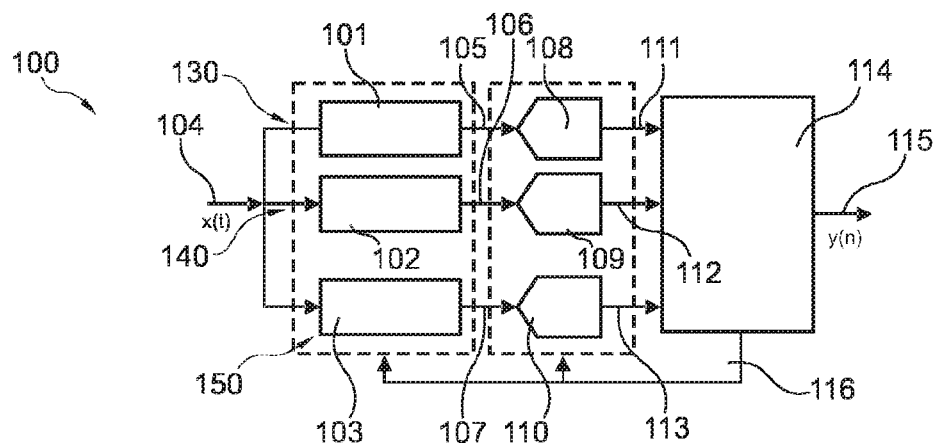
FIG. 1 shows an ADC based on multiple identical ADCs according to an exemplary embodiment of the invention.

The illustration in the drawing is schematical. In different drawings, similar or identical elements are provided with the same reference signs.

In the following, referring to FIG. 1, a device 100 for processing data according to an exemplary embodiment of the invention will be explained.

The device comprises a first signal path 130, a second signal path 140 and a third signal path 150, wherein the signal paths 130, 140, 150 are connected in parallel.

The device 100 comprises a plurality of signal conditioning units 101 to 103 each receiving an identical analog input signal 104, wherein each of the plurality of signal conditioning units 101 to 103 is adapted for generating a respective analog intermediate signal 105 to 107 by manipulating an amplitude of the analog input signal 104.

A plurality of analog to digital converting units 108 to 110 are provided each of which being assigned to a corresponding one of the plurality of signal conditioning units 101 to 103 and being supplied with the respective analog intermediate signal 105 to 107. Each of the plurality of analog to digital converting units 108 to 110 is adapted for performing an analog to digital signal conversion function thereby generating a respective digital intermediate signal 111 to 113 based on the respective analog intermediate signal 105 to 107.

Furthermore, a digital signal processing (DSP) unit 114 is provided, which is supplied with the plurality of digital intermediate signals 111 to 113 and is adapted for generating a digital output signal 115 by processing the digital intermediate signals 111 to 113.

Each of the plurality of signal conditioning units 101 to 103 is adapted for selectively amplifying or attenuating the analog input signal 104 when generating the respective analog intermediate signal 105 to 107 to thereby adjust a portion of the respective analog intermediate signal 105 to 107 being processable by the assigned one of the plurality of analog to digital converting units 108 to 110, particularly in view of a value of a full scale range of the assigned one of the plurality of analog to digital converting units 108 to 110. The digital signal processing unit 114 is adapted for detecting clipping in any one of the digital intermediate signals 111 to 113 of any one of the plurality of analog to digital converting units 108 to 110 and is adapted for generating the digital output signal 115 under consideration of a detected clipping (for instance by disregarding clipping signal parts). Particularly, the digital signal processing unit 114 is adapted for substituting a clipping portion of any one of the digital intermediate signals 111 to 113 by a non-clipping portion of any one of the digital intermediate signals 111 to 113.

Via a feedback line 116, the digital signal processing unit 114 steers operation of the ADCs 108 to 110 and of the signal conditioning units 101 to 103. By such a feedback loop, the operation of the system 100 can be improved dynamically.

The architecture of FIG. 1 is appropriate for processing broadband analog input signals 104.

In the following, a multiple analog to digital converter architecture for improved or optimal sampling of broadband signals according to exemplary embodiments of the invention will be explained.

According to an exemplary embodiment of the invention, a method is used to optimally sample broadband signals. The sampling method can be used to relax the requirements of the Analog to Digital Converter (ADC) when used in a receiver that processes broadband signals such as for example ones that have Gaussian amplitude distribution properties, or signals that are corrupted momentarily by burst of strong interferers. Embodiments of the invention are particularly suited for multiband multi-channel receivers that force paradigm-shift in today's receiver technology.

The role of a multi-channel receiver in this case is to deliver at its output a multiplicity of signals simultaneously. Thus, the receiver user can by means of control functions decide how many and which sub-signals from he/she wishes to receive. Then these signals are selected and delivered at the receiver output simultaneously.

A fundamental difference between the conventional and multi-channel and/or multiband receiver is thus the capability of simultaneous reception of signals from various channels and/or bands.

Figure 2:
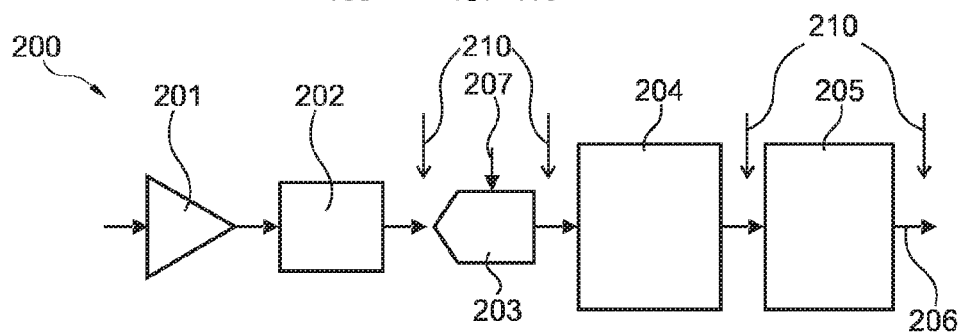
FIG. 2 shows a conceptual scheme of a multi-band or multi-channel receiver.

An implementation of such a receiver 200 is shown in FIG. 2.

The receiver 200 comprises an RF amplifier 201, a filter 202, an ADC 203 controlled by a clock signal 207, a multi-band/channel signal processing unit 204, and a baseband signal processing unit 205 to generate an output 206. Multi-bands/channels are denoted with reference numerals 210.

Basic analog circuits are a wideband RF amplifier 201 with a filter 202, and a high speed Analog to Digital Converter 203. From an implementation point of view, this receiver architecture offers a much simpler system compared to a conventional single channel receiver because it has fewer circuits, which can all be integrated. Moreover, the digital implementation of the channel selection filters increases robustness and programmability to various standards (for instance multi band).

A bottleneck in the mentioned architecture is related to the stringent requirements placed on the ADC 203 and the front-end RF amplifiers 201 because they process all signals of all bands/channels making the implementation of such a receiver 200 a significant challenge. The multiplicity of signals causes effects that increase the requirements for the dynamic range of the ADC 203 compared to the single-channel case. One of those important effects relates to the nature of the input signal. The sum of a large number of sinusoids with different frequencies and random phase relationship with respect to each other is a random signal whose amplitude distribution has Gaussian properties. As the number of sinusoids is increased the combined signal resembles more and more a Gaussian distributed signal. Similarly, the combination of multiple separate signals belonging to different bands and channels gives rise to a signal with Gaussian amplitude distribution.

Figure 3:
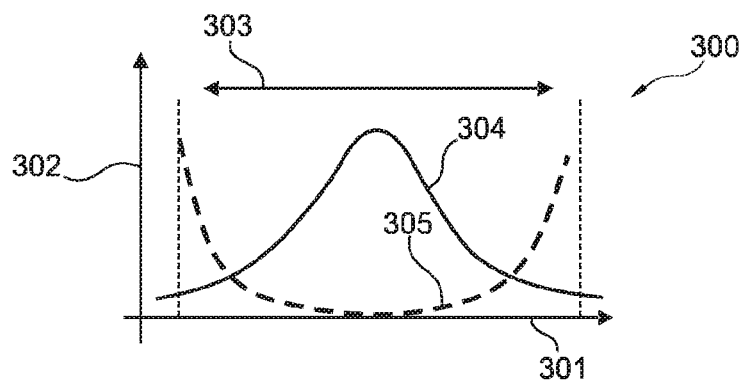
FIG. 3 shows an amplitude distribution of a Gaussian signal.

Such a signal is shown in FIG. 3.

FIG. 3 shows a diagram 300 having an abscissa 301 along which an input signal amplitude is plotted and having an ordinate 302 along which a probability is plotted. An ADC full scale range 303 is shown as well. A first curve 304 relates to a Gaussian signal, and a second curve 305 relates to a sinusoidal signal.

The distribution of a sinusoid 305 is shown in FIG. 3 as well. An important characteristic of the Gaussian distributed signal 304 is that there are moments in time where the individual signals add coherently in time and produce a total signal with very high amplitude. Although this effect occurs quite rarely, in practice it causes significant problems.

Figure 4:
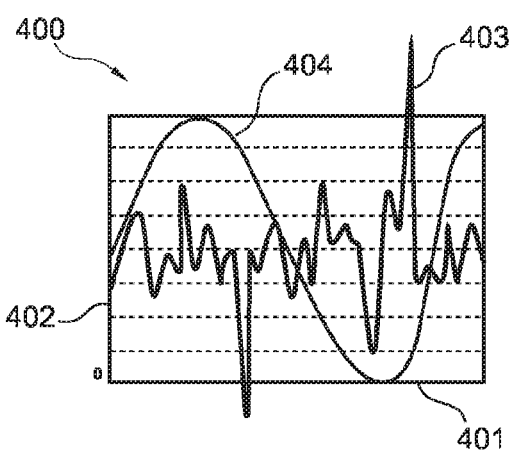
FIG. 4 shows a full-scale sinusoid and a signal with two peaks that are clipped.
Figure 5:
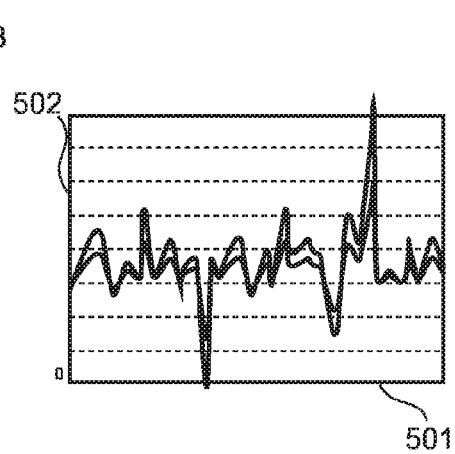
FIG. 5 shows the same random signal as in FIG. 4 attenuated to fit in the ADC range without introducing clipping.

The resulting effect can be observed in FIG. 4, FIG. 5.

FIG. 4 shows a diagram 400 having an abscissa 401 along which the time is plotted and having an ordinate 402 along which an amplitude is plotted. A first curve 403 relates to a signal, and a second curve 404 relates to a sinusoidal signal.

FIG. 5 shows a diagram 500 having an abscissa 501 along which the time is plotted and having an ordinate 502 along which an amplitude is plotted. The curves relate to the signal 403, but is attenuated.

In FIG. 4, FIG. 5, two signals are compared to the ADC input full-scale range. The signal 404 is a sinusoid; the signal 403 is the sum of many sinusoids with random phase and different frequencies. The dashed lines show the quantization levels (only a few are shown for easy of demonstration). For most of the time the amplitude of the random signal 403 is close to its average value, and only occasionally it peaks. The ratio between the maximum values of a signal over its root mean square value is called the crest factor (for a sinusoid this ratio is 3 dB, whereas for a pure Gaussian signal around 12 dB). If the range of the ADC 203 is not large enough, the peak overloads the ADC 203, which produces a clipped sample corrupting the signal. This occurs in the signal shown in FIG. 4: the two peaks outside the range of the ADC 203 (0 and Full scale) will be digitized as zero and full scale (for instance 000 . . . 000 and 111 . . . 111, respectively).

If the signal 403 is amplified too much before supplied to the ADC 203, clipping will occur more often and the signal will be corrupted significantly. On the other hand, if the signal 403 is not amplified sufficiently, the resulting quantization noise will be much larger again corrupting the signal 403 substantially. In the presence of strength differences between channels or bands, the weak signals are contaminated much easier from clipping or quantization generated noise than their strong counterparts and their detection becomes even more difficult.

An existing approach to address this problem is the so-called "golden compromise" between the effects of quantization noise and clipping noise: the signal should fit optimally in the ADC range by adjusting properly the power of the input signal 403 to the one that the ADC 203 can handle with a given probability of clipping events. In FIG. 5 for example, two scaled versions of the same signal 403 are compared to the ADC full scale and its quantization levels: the more attenuated line will generate no clipping at all but it will be distorted significantly by quantization noise. The less attenuated line shows the same signal 403 optimally fitted to the ADC range such that barely any clipping occurs. However, still quantization effects can be an issue.

The tolerable amount of signal clipping varies from modulation scheme to another. Digital modulation with small modulation depth (for instance QPSK systems for satellite receiver applications) allows a large number of clipping events. For QAM with large modulation depth (64 or 256 QAM used for example for digital cable TV) clipping is in fact not tolerated. This causes an effective loss of resolution since for most of the time the signal is around the center and is corrupted from quantization noise while only seldom it reaches the outer edges of the ADC range. For a Gaussian-like signal, if clipping is not allowed then the ADC dynamic range loss of around 9 dB (1.5 bits).

In practice, there are further complications due to circuit imperfections that require even more dynamic range from the ADC than these 9 dB. For digital communication systems, the optimal compromise between clipping and quantization is narrow because of the large sensitivity of digital communication systems to noise levels (small differences in noise can cause drastic changes in bit error rates). Therefore, deviation from the optimal gain that guarantees equilibrium between clipping and quantization noise due to circuit implementation non-idealities will cause significant system bit error rate degradation. As a result this requires very fine gain control (many small gain steps, for instance 0.2 dB in 20-30 dB range) at the RF amplifiers 201 preceding the broadband ADC 203, which complicates the receiver 200 design significantly, or requires more dynamic range from the ADC 203.

The mentioned problems may be shown in more detail with the use of MATLAB simulations of a satellite receiver (satellite tuner) that emulates the DVB-S protocol in a home set-top box. The RF input signal of this set-top box consists of a multiplicity of QPSK modulated sub-signals each with a bandwidth or roughly 30 MHz. The sub-signals are located at different carrier frequencies within the 950-2150 MHz. An additional 20 dB of cable tilt (attenuation of higher frequencies at the right edge of the band compared to lower frequencies at the left edge of the band) is assumed as well, which is commonly encountered in practice, and which complicates broadband receivers even further. The signals are furthermore corrupted by noise, which represents all noise sources of the antenna and the RF circuits preceding the ADC.

The receiver being simulated uses a single ADC 203 as in FIG. 2 to sample the complete satellite band (thus, a multi-channel receiver with a single ADC). It is assumed that the amplification in FIG. 2 is done in two steps: first the satellite RF signal is amplified to 0.5V (rms) with a coarse amplification stage, then a fine amplification stage tunes the 0.5V (rms) signal further in smaller steps such that it fits optimal to the ADC.

Figure 6:
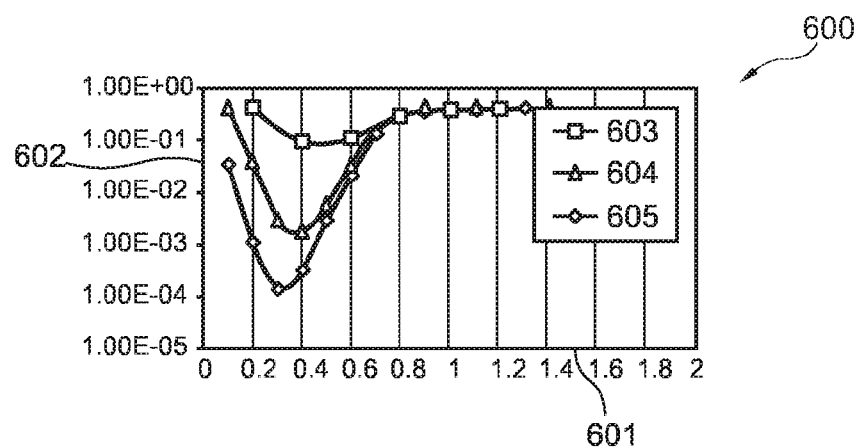
FIG. 6 shows a tradeoff between quantization and clipping effects.

The effects of clipping and quantization that the ADC adds to the signal are observed by looking the resulting Bit Error Rate (BER) performance in FIG. 6 after the so-called Viterbi decoder.

FIG. 6 shows a diagram 600 having an abscissa 601 along which a fine Automatic Gain Control (AGC) setting is plotted and having an ordinate 402 along which a Bit Error Rate (BER) is plotted. A first curve 603 relates to a 4 bits ADC, a second curve 604 relates to a 5 bits ADC, and a third curve 605 relates to a 6 bits ADC.

The BER is plotted as a function of the (normalized) fine amplification (amplification 1 means that the 0.5V signal is left as is) and for various ADC bit values. DVB-S defines a system BER=$2*10-4$ at the output of the Viterbi decoder as the minimum for proper reception. The simulations demonstrate the tradeoff between clipping and quantization noise for DVB-S. For a given resolution, when the signal amplification is too low, quantization noise dominates the BER. If the signal is amplified too much, then the BER is dominated by distortion caused by clipping.

From FIG. 6 it can be seen that the optimal area for low BER is pretty narrow. For example, BER=$2*10-4$ is satisfied with an ideal 6 bit ADC and with a gain margin of about 0.1. Gain deviation of 5% from the ideal gain value, for instance due to process spread in the Automatic Gain Control (AGC) amplifiers and filters will cause large impact on the resulting BER. This shows that either even more bits are required for the ADC to increase the BER window (for instance 7 in our example), or alternatively very high gain resolution (many gain steps) to tune the gain very accurately. Systems using 64 or 256 QAM have even narrower optimal regions (in this example QPSK allows a lot of clipping before BER degradation occurs).

The first approach shifts even more problems to the broadband ADC, while the second to the AGC amplifier. While the latter is not a major problem for single-channel receivers because the corresponding amplifiers make gain adjustments only at a bandwidth equal to that of the channel (for instance 30 MHz for satellite DVB-S, 8 MHz for cable TV), it becomes an issue when these gain adjustments must be offered at a bandwidth of a few GHz while still satisfying noise and linearity requirements.

The resolution values depicted in FIG. 6 (for instance 6, or 7 bits) refer to ideal converters where their quantization levels are infinitely accurately positioned within the reference level and this accuracy is maintained within the complete frequency band of operation (950-2000 MHz) in this case. For practical application, these values should better be considered as the minimum effective number of bits (ENOB) at these frequencies. In that respect, it can be realized that they represent values already beyond the state of the art CMOS implementations, for instance 7.26 ENOB close to 800 MHz and 1.6 Gsample/sec with ~1 Watts power dissipation, or 6 ENOB at 2 GHz and 20 Gsample/sec consuming 10 W.

For the DVB-S example simulated in FIG. 6 an analysis indicates that at least 8 effective bits up to 1 GHz signal frequencies at 2 Gsample/sec are required for a reliable receiver, which is already beyond the state of the art. For future cable TV Tuners (for instance for DOCSIS 3.0) that form a focus at this moment, the traditional approach would require more than 10-12 effective bits at signal frequencies exceeding 1 GHz with a minimum of 2.4 Gsample/sec and power consumption well below 1 Watt.

Further technical progress in these application areas requires innovative sampling methods that can reduce the dynamic range requirements of ADC's while simultaneously improving the receiver robustness.

One aspect of the invention will be described with the conceptual scheme from FIG. 1.

This architecture comprises an array of signal conditioning circuits 101 to 103, an array of ADCs 108 to 110 and a digital signal processing circuit 114. Each signal conditioning circuit 101 to 103 processes the same input RF signal 104. Each one emphasizes specific parts of the total RF signal 104 that will be detected by the following ADC 108 to 110. This ADC 108 to 110 is specially built to detect those emphasized parts in the most optimal way. A dedicated digital signal processing circuit 114 after the ADC arrays 108 to 110 receives all the digitized streams 111 to 113 and from them builds one digital output signal 115 that represents in the most optimum way the analog input signal 104. The way it builds this digital signal 115 may be based on non-linear or linear signal processing, for instance comparisons, rejection of specific values, outlier rejection, sorting, amplifications. The combination of all these parallel chains 130, 140, 150 of circuits makes in total one ADC 100.

The conditioning of the input signal 104 by each of the signal conditioning circuits 101 to 103 and the operation of the ADCs 108 to 110 can be fixed, or programmed during operation, start-up, etc. It depends on whether a-priori or a-posteriori input signal information is used. A-priori means that properties of the input signal (for instance amplitude distribution, crest factors, amplitude, frequencies) are known at the design phase and the system is configured/optimized against them by design. A-posteriori means that the system can gather information while it operates and control/program the ADC such that it becomes optimal to the conditions that apply at a given time by programmable means.

The architecture according to exemplary embodiments of the invention should not be confused with a conventional multi-channel receiver architecture that uses multiple identical single-channel receivers in parallel. There, each single-channel receiver realizes channel selection: it separates a specific portion of the RF signal between two frequencies and moves the signal of a given channel around a fixed frequency for the ADCs to sample easier. Each ADC delivers then a specific (user selected) channel for demodulation to the digital channel decoder.

According to exemplary embodiments of the invention, the individual signal conditioning circuits is able to emphasize/separate both amplitude and frequency parts of the original RF signal such that each of them is sampled and quantized in an advantageous or even in the most optimal way: the resulting outputs are then processed by a dedicated (fixed or programmable) digital signal circuit that uses the multiple separate data streams and uses algorithms to build the best possible representation of the original signal and to control/program the circuits preceding it. Channel selection will be performed only latter, after the previously mentioned operation is finished.

Further exemplary embodiments of the invention and their benefits will be demonstrated next.

A feature in these exemplary embodiments is to sample properly a Gaussian-like signal exploiting the particular shape of its amplitude distribution function (see FIG. 3) without the extra cost of resolution that is normally required because of its large crest factor. These examples may realize non-uniform quantization.

Several other possibilities following the generic method described herein and shown in FIG. 1 are possible, each solving a different broadband signal problem (other than the crest factor).

Figure 7:
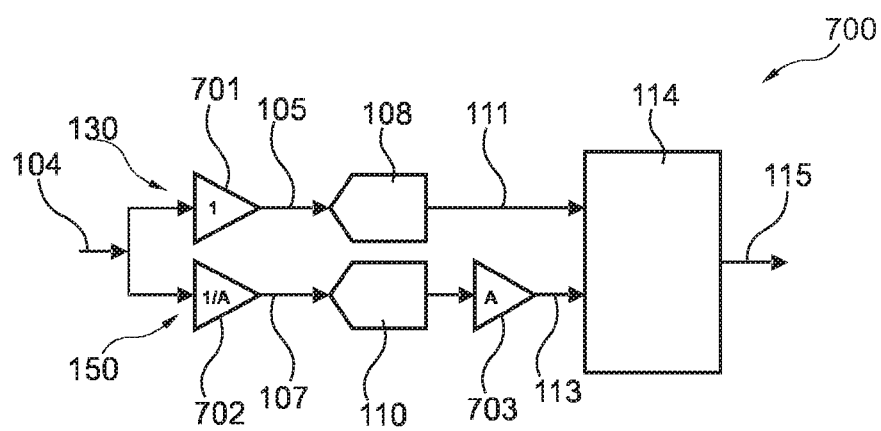
FIG. 7 shows an ADC based on two identical ADC units according to an exemplary embodiment of the invention.

A device 700 according to an exemplary embodiment of the invention is shown in FIG. 7.

The conceptual structure of FIG. 1 is easily identified in FIG. 7. The input signal 104 is passed on to two amplifiers 701, 702. The first amplifier 701 realizes unity gain, the second amplifier 702 attenuation by A (for instance with resistor divider or differential amplifiers in the voltage domain, or a current splitter in the current domain). The two ADCs 108, 110 may be identical (which is not a requirement) and they may clock at the same time; consequently the sampled signals are only a scaled version of each other. While the ADC 108 may clip, the ADC 110 will not because it receives an attenuated signal that still lies within its full-scale range. In this manner, the clipped samples are be replaced by coarsely quantized samples, which is much easier to deal with.

Clipping of the output signal 111 of the ADC 108 is detected comparing it for example with the values 111 . . . 1 and 000 . . . 0. This operation requires a very simple digital circuit. If a clipped sample is detected, it is replaced with the non-clipped obtained from the ADC 110 after its gain is restored digitally.

For example, this can be done with a multiplexer that is controlled by the result of the previous comparison. One input of the multiplexer is the output of the ADC 108, the other is the output of the ADC 110 and the control signal is the result of the mentioned comparison.

Figure 8:
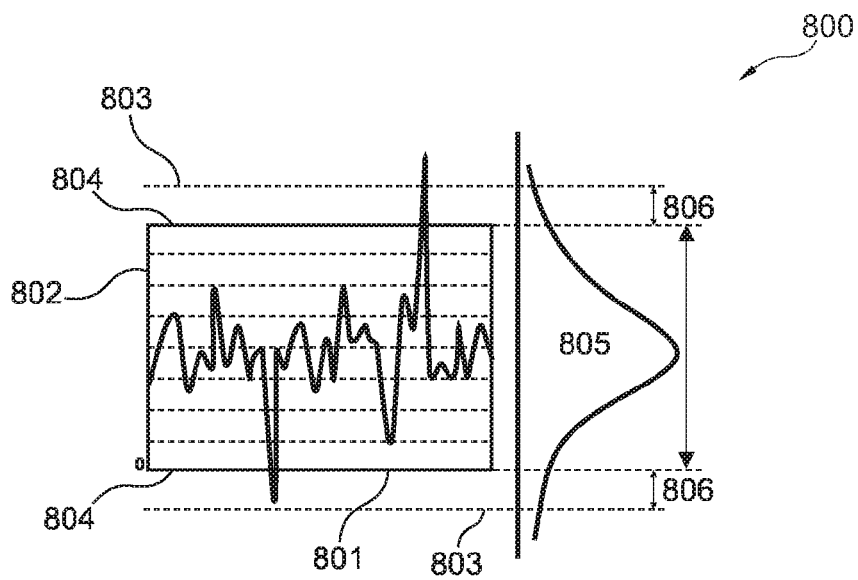
FIG. 8 shows a distribution of the total amplitude quantization range in two sub-ranges.

FIG. 8 shows how the range of the input signal 104 is distributed in the two ADCs 108, 110 with the use of the attenuator A.

More particularly, FIG. 8 shows a diagram 800 having an abscissa 801 along which the time is plotted and having an ordinate 802 along which an amplitude is plotted. A full-scale is denoted by reference numeral 804, and an over-range is denoted by reference numeral 803. A detection range of the ADC 108 is denoted by reference numeral 805, and a detection range of the ADC 110 is denoted by reference numeral 806.

The value of gain A determines the amplitude range 806 of values captured by the ADC 110 before it clips as well. In practice, a value of 2-4 is sufficient. Moreover, its absolute value is not important, thus the exact gain and gain matching between analog attenuator and digital amplifier is not very important (this is a strong advantage in circuit realization).

Benefits of this aspect may be demonstrated using MATLAB simulations of a satellite TV receiver system as before without loss of generality for other systems that require many more bits (for instance 10-12 bits for broadband multi-channel cable TV receivers).

Figure 9:
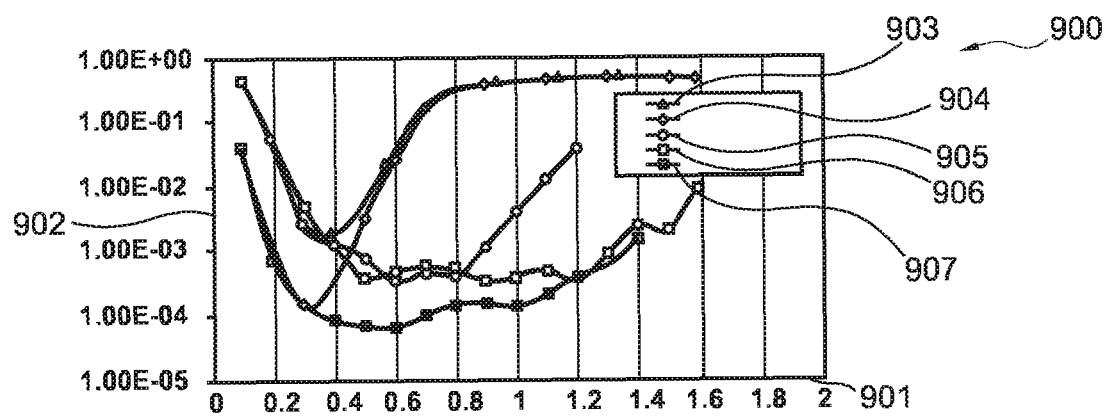
FIG. 9 shows a quantization versus clipping effects with the dual ADC architecture according to an exemplary embodiment of the invention.

The results are shown in FIG. 9.

FIG. 9 shows a diagram 900 having an abscissa 901 along which a fine Automatic Gain Control (AGC) setting is plotted and having an ordinate 902 along which a Bit Error Rate (BER) is plotted. A first curve 903 relates to single 5 bits, a second curve 904 relates to single 6 bits, a third curve 905 relates to dual 5 bits A=½, a forth curve 906 relates to dual 5 bits A=⅓, a fifth curve 907 relates to dual 6 bits A=⅓.

The results show clearly that

Using two ADCs 108, 110 in parallel according to FIG. 7 reduces clipping substantially and improves the BER close to an order of magnitude compared to one ADC.

The optimal gain range is substantially enlarged. This means that the dynamic range of the ADC 700 is exploited optimally without further need for extra dynamic range or high gain resolution (many gain steps) to guarantee optimal BER.

Concerning the specific values in the example, the dual 5 bit ADC has slightly less peak performance than a single 6 bit ADC in exchange for a wide optimal gain range. This shows evidence that in practice, a single ADC with slightly improper gain setting will operate much worse than a corresponding dual ADC. Furthermore, in most cases two ADCs with N bits are more power efficient than one ADC with N+1 bit at the same frequency range.

The same technique may be extended to three to exploit additional benefits (the generalization to more segments is straightforward).

Figure 10:
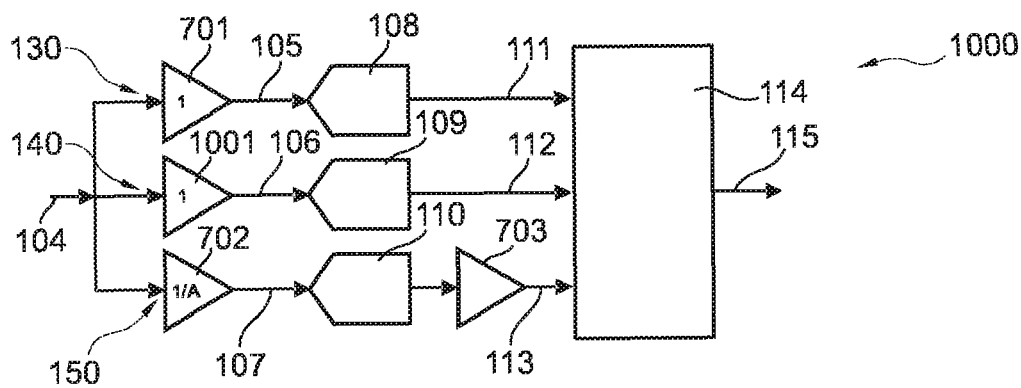
FIG. 10 shows a device having triple-ADC unit architecture according to an exemplary embodiment of the invention.

A triple ADC 1000 according to an exemplary embodiment of the invention is shown in FIG. 10.

The total ADC voltage range is assumed to be between −FS to +FS in a differential configuration (FS=0.5V in a satellite simulation example). The ADC 108 has higher resolution than the ADC 109 and the ADC 110 but covers only a small fraction of the total input range from −0.125 FS to +0.125 FS with 6 bits (i.e. 0.125*26=8 levels). For the rest of the range it simply clips, or its result is neglected. The ADC 109 covers the complete range −FS to FS with less resolution (i.e. 25*0.875=28 levels). In other words, a total of 36 quantization levels (4 more than a uniform 5 bit ADC) are used in place of 64 of a uniform 6 bit ADC.

Finally, the ADC 110 uses the technique shown in the dual ADC architecture of FIG. 7 to offer extra range and reduce clipping as above.

Figure 11:
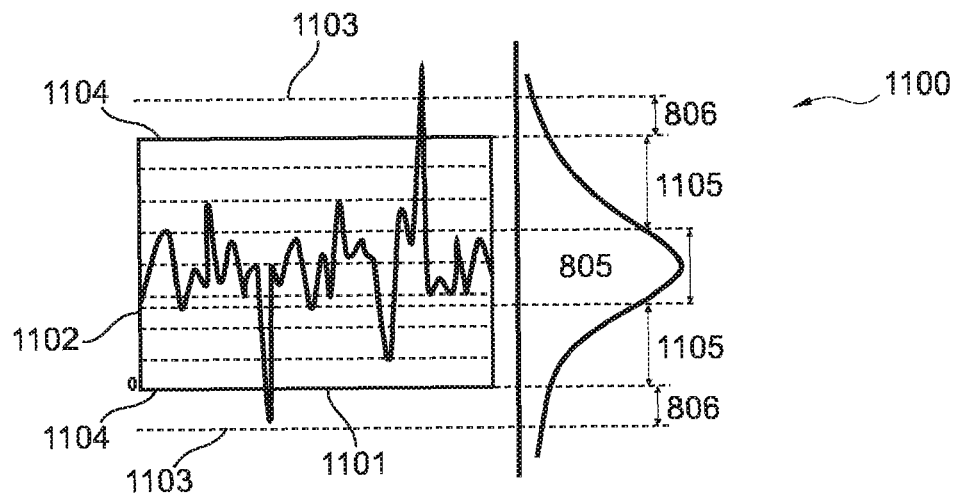
FIG. 11 shows a distribution of the total amplitude quantization range in three sub-ranges.

The distribution of resolution in the signal range is given in FIG. 11.

More particularly, FIG. 11 shows a diagram 1100 having an abscissa 1101 along which the time is plotted and having an ordinate 1102 along which an amplitude is plotted. A full-scale is denoted by reference numeral 1104, and an over-range is denoted by reference numeral 1103. A detection range of the ADC 108 is denoted by reference numeral 805, a detection range of the ADC 109 is denoted by reference numeral 1105 and a detection range of the ADC 110 is denoted by reference numeral 806.

Figure 12:
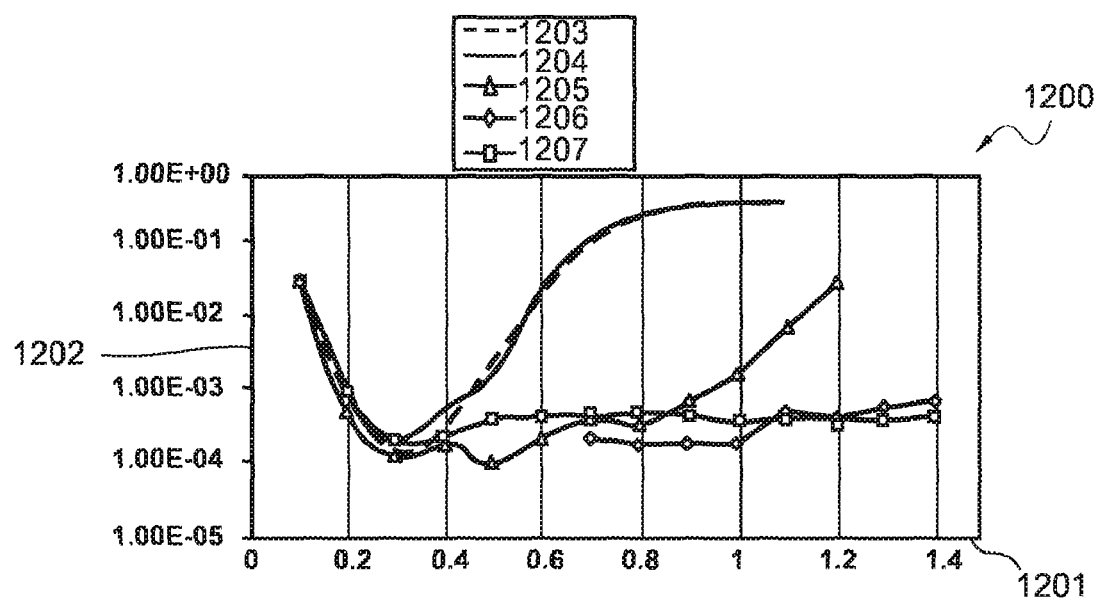
FIG. 12 shows quantization versus clipping effects with single-, dual-, and triple-ADC systems according to an exemplary embodiment of the invention.

FIG. 12 shows comparisons of different configurations.

More particularly, FIG. 12 shows a diagram 1200 having an abscissa 1201 along which a fine Automatic Gain Control (AGC) setting is plotted and having an ordinate 1202 along which a Bit Error Rate (BER) is plotted. A first curve 1203 relates to single 6 bits, a second curve 1204 relates to ADC 108 6 bits and ADC 110 6 bits, a third curve 1205 relates to ADC 108 6 bits and ADC 109 5 bits and ADC 110 6 bits and A=½, a forth curve 1206 relates to ADC 108 6 bits and ADC 109 5 bits and ADC 110 5 bits and A=¼, and a fifth curve 1207 relates to ADC 108 6 bits and ADC 110 6 bits and A=⅓.

First, it be seen that a single 6 bit ADC with 64 levels spread uniformly from −FS to FS is comparable to a dual ADC using ADC 108 and ADC 110 (without ADC 109 for over-range) as described above (that is, with only 36 quantization levels). This is due to the Gaussian nature of the amplitude distribution function of the signal, it resides for most of the times within the range of ADC 108. Using ADC 108 and ADC 110 in such configuration can for example lead to approximately 50%. power consumption and area reduction.

Next, the ADC 109 with 5 bits is added next to the ADC 108 with 6 bits, and to the ADC 110 with 5 bits as well. This gives extra over-range to reduce clipping. Of course, ADC 109 can be selected to have more bits (for instance 6) but it is kept lower for the sake of comparison. The attenuation A is kept as parameter and takes the values ½, ⅓, and ¼. Finally, the last curve uses the dual configuration for comparison.

These simulations plots indicate the various performance tradeoffs obtainable with the corresponding selection of the number of bits for covering the main full scale range (ADC 108 and ADC 110) and the over-range covered by ADC 109. The proper choice of these parameter is a choice that can be either made a-priori the design phase, or a-posteriori and helps to optimize quality reception with the minimum possible use of resources. The distribution of quantization levels were only selected after a-priori knowing that an almost Gaussian signal will be processed.

However, one aspect of the invention is that the optimal ranges and the process of selecting the proper ranges can be controlled digitally by information that is obtained as the system runs (a-posteriori). For example, on chip detection hardware can identify the crest factor of the signal received and steer with the help of the dedicated digital block the choice of A to allow higher/lower abrupt excursions of the input signal to be captured. This can be particular useful for signals in a real home-receiver environment that are Gaussian-like and not ideally Gaussian and whose crest easily varies goes 3 dB up or down from the ideal 12 dB. In many real cases of receiving signals, even if the wanted signals have Gaussian properties, a narrowband strong interferer may result in a completely different signal and temporally overload the receiver because it forces the signal to reside in the edges of the ADC (for instance a narrowband GSM signal interfering on a weak broadband cable TV signal). In such a case a multi-ADC system with over-range is still able to provide good quality signals without interrupting data transmission, and without any need adjusting the gain of the system.

Such operations can allow the BER quality to be maintained (thus, to increase the system robustness), or for power resources to be saved.

Similarly, the number of bits of the ADCs can be controlled given that they offer programmable bit selection. A programmable ADC can be used to save power when extra bits or one of the ADCs are not needed, or when for a given number of bits the distribution of the ADC levels can be kept dense only where it is needed. Successive Approximation and Pipelined ADC architectures that are particularly suited for very high-speed Time Interleaved A/D converters may offer inherent possibilities for such programmability.

Next, examples of programmability will be discussed.

An example of how a control a process can be made is given next. From the digitized samples the dedicated digital processing circuit can generate an histogram of the amplitudes of the signal. This histogram in combination with the BER estimated by other circuit elements of the total receiver system (hardware that makes BER estimations is commonly encountered in receivers nowadays) may then be used to extend or reduce the attenuation range A (for instance for a resistive divider this means to switch on/off a resistor), to reduce the range of ADC 108 while extending that of ADC 110, to shut down all the circuits that relate to the non-used regions, etc.

Next to the reduction of the number of quantization levels (ADC 108 and ADC 110) and especially next to the substantial reduction of the influence of clipping (ADC 109), the advantages of a multi-ADC approach can further extend to the relaxation of the accuracy of the positions of the quantization levels generated by ADC 109 and ADC 110. This allows further hardware reduction in favor of higher speed and lower power consumption. According to an exemplary embodiment of the invention it may be appropriate to use architectures suited for high resolution and high speed. Nevertheless, it became possible to reduce the power consumption of the converter by as far as 50% combining non-uniform quantization (less quantization levels, thus less hardware elements) with relaxed accuracy requirements for the less dense quantization areas.

It is possible to use the assumption of a Gaussian signal to limit the effects of clipping in the ADC. All clipped signals (i.e. 00 . . . 0 and 11 . . . 1) may be replaced by the most probable value beyond the range of the ADC, which can be identified digitally under the assumptions of a Gaussian signal. This leads to a compact and very simple digital hardware solution that can be part of any ADC. Its effectiveness is however limited by the fact that the signal can not be amplified much since the clipped values (that increase when the gain increases) are always mapped to one value, independent of how much they exceed the full scale range of the ADC. Therefore, they remain clipped. Moreover, any strong deviation from the assumed Gaussian model (for instance when interferers are present) may limit the system identically to a standard single ADC.

Figure 13:
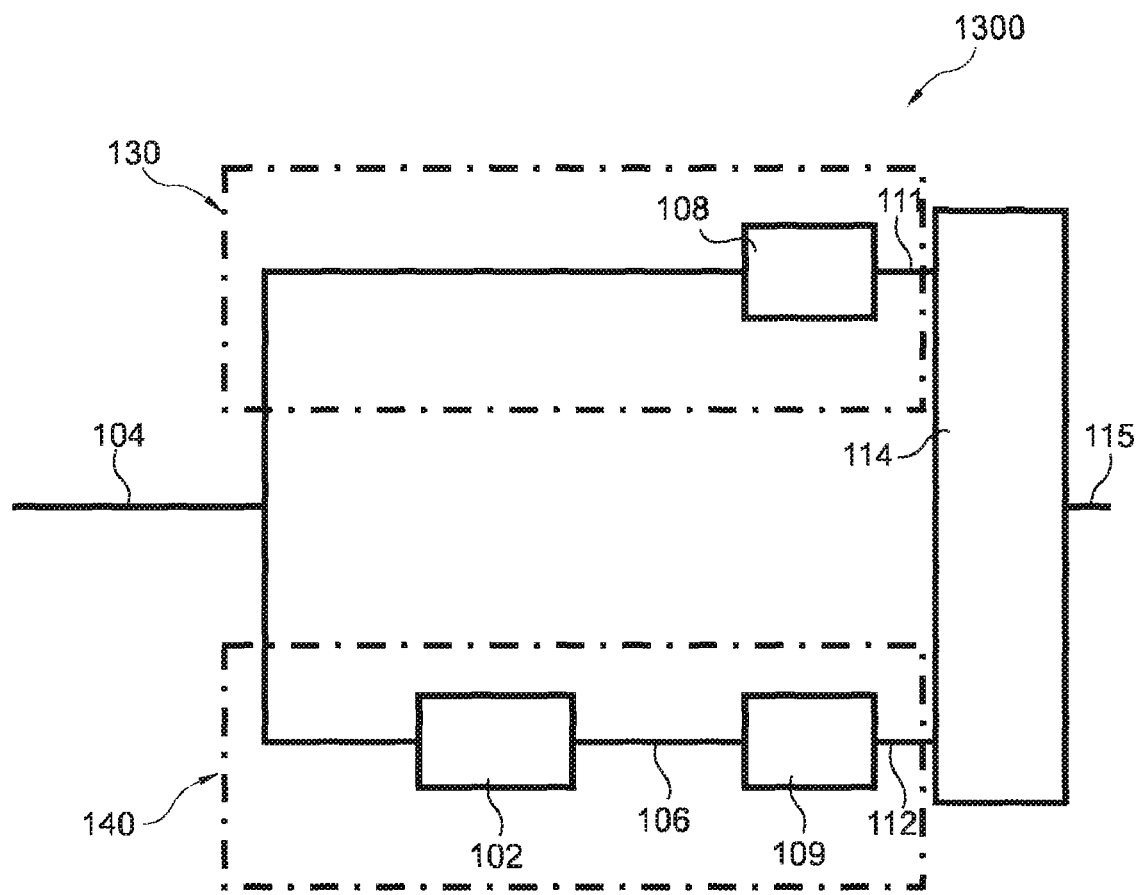
FIG. 13 shows an ADC based on multiple individual ADCs according to an exemplary embodiment of the invention.

FIG. 13 shows an ADC 1300 unit based on two (2) ADCs, which is a first ADC 108 and second ADC 109 according to an exemplary embodiment of the invention.

A feature of the embodiment of FIG. 13 is that the signal path 130 in which the ADC 108 is connected does not comprise any signal conditioning unit. Thus, the analog input signal 104 is directly supplied to the ADC 108. In contrast to this, the signal path 140 in which the ADC 109 is connected comprises a signal conditioning unit 102 manipulating the input signal. Thus, the signal conditioning unit 102 causes an asymmetry in the signals 104, 106 to be supplied to the ADCs 108, 109. Therefore, the signal conditioning unit 102 causes that the ADCs 108, 109 are sensitive to the input signal 104 in a varying manner. Again, the DSP unit 114 serves to reconstruct a digital representation 115 of the input signal 104 based on the output of the ADCs 108, 109. In other words, each of the ADCs 108, 109 has a specific function contributing to the analog-to-digital conversion of the signal 104.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:
1. A device for processing data, the device comprising
a signal conditioning block adapted for manipulating a property of an analog input signal;
a plurality of analog to digital converting units each adapted for generating a respective digital intermediate signal based on an output of the signal conditioning block;
a digital signal processing unit supplied with the plurality of digital intermediate signals, wherein the digital signal processing unit is adapted for generating a digital output signal by processing the digital intermediate signals; and
a plurality of signal paths each receiving the identical analog input signal;
wherein the signal conditioning block comprises at least one signal conditioning unit in at least one of the plurality of signal paths, wherein each signal conditioning unit is adapted for generating a respective analog intermediate signal by manipulating the property, particularly an amplitude, of the analog input signal;
wherein each of the plurality of analog to digital converting units is assigned to a corresponding one of the plurality of signal paths and is supplied with the analog input signal or a respective analog intermediate signal, wherein each of the plurality of analog to digital converting units is adapted for generating a respective digital intermediate signal based on the respective analog intermediate signal or based on the analog input signal;
wherein the at least one signal conditioning unit is adapted for selectively amplifying or attenuating or integrating the analog input signal when generating the respective analog intermediate signal to thereby adjust a portion of the respective analog intermediate signal being processible by the assigned one of the plurality of analog to digital converting units in view of a characteristic, particularly in view of a value of a full scale range, of the assigned one of the plurality of analog to digital converting units.

2. The device of claim 1, wherein the digital signal processing unit is adapted for detecting clipping of any one of the digital intermediate signals of any one of the plurality of analog to digital converting units and is adapted for generating the digital output signal under consideration of a detected clipping.

3. The device of claim 2, wherein the digital signal processing unit is adapted for substituting a clipping portion of any one of the digital intermediate signals by a non-clipping portion of any other one of the digital intermediate signals.

4. A device for processing data, the device comprising
a signal conditioning block adapted for manipulating a property of an analog input signal;
a plurality of analog to digital converting units each adapted for generating a respective digital intermediate signal based on an output of the signal conditioning block;
a digital signal processing unit supplied with the plurality of digital intermediate signals, wherein the digital signal processing unit is adapted for generating a digital output signal by processing the digital intermediate signals;
a plurality of signal paths each receiving the identical analog input signal;
wherein the signal conditioning block comprises at least one signal conditioning unit in at least one of the plurality of signal paths, wherein each signal conditioning unit is adapted for generating a respective analog intermediate signal by manipulating the property, particularly an amplitude, of the analog input signal;
wherein each of the plurality of analog to digital converting units is assigned to a corresponding one of the plurality of signal paths and is supplied with the analog input signal or a respective analog intermediate signal, wherein each of the plurality of analog to digital converting units is adapted for generating a respective digital intermediate signal based on the respective analog intermediate signal or based on the analog input signal;
wherein a first one of the at least one signal conditioning unit comprises a first amplifier having a gain factor of one, and wherein a second one of the at least one signal conditioning unit comprises a second amplifier having a gain factor of less than one;
wherein the digital signal processing unit is adapted for detecting clipping of the digital intermediate signal provided by the analog to digital converting unit coupled to the first amplifier and is adapted to replace a clipping sample of the analog to digital converting unit coupled to the first amplifier by a non-clipping sample of the analog to digital converting unit coupled to the second amplifier.

5. The device of claim 4, wherein a value of a full scale range of the analog to digital converting unit coupled to the first amplifier is smaller than a value of a full scale range of the analog to digital converting unit coupled to the second amplifier.

6. The device of claim 4, wherein a resolution of the analog to digital converting unit coupled to the first amplifier is larger than a resolution of the analog to digital converting unit coupled to the second amplifier.

7. A device for processing data, the device comprising
a signal conditioning block adapted for manipulating a property of an analog input signal;
a plurality of analog to digital converting units each adapted for generating a respective digital intermediate signal based on an output of the signal conditioning block;
a digital signal processing unit supplied with the plurality of digital intermediate signals, wherein the digital signal processing unit is adapted for generating a digital output signal by processing the digital intermediate signal;
a plurality of signal paths each receiving the identical analog input signal;
wherein the signal conditioning block comprises at least one signal conditioning unit in at least one of the plurality of signal paths, wherein each signal conditioning unit is adapted for generating a respective analog intermediate signal by manipulating the property, particularly an amplitude, of the analog input signal;
wherein each of the plurality of analog to digital converting units is assigned to a corresponding one of the plurality of signal paths and is supplied with the analog input signal or a respective analog intermediate signal, wherein each of the plurality of analog to digital converting units is adapted for generating a respective digital intermediate signal based on the respective analog intermediate signal or based on the analog input signal;
wherein a third one of the at least one signal conditioning unit comprises a fourth amplifier having a gain factor of one;
wherein a value of a full scale range of the analog to digital converting unit coupled to the first amplifier is smaller than a value of a full scale range of the analog to digital converting unit coupled to the forth amplifier.

* * * * *